US006202189B1

United States Patent
Hinedi et al.

(10) Patent No.: US 6,202,189 B1
(45) Date of Patent: Mar. 13, 2001

(54) PUNCTURED SERIAL CONCATENATED CONVOLUTIONAL CODING SYSTEM AND METHOD FOR LOW-EARTH-ORBIT SATELLITE DATA COMMUNICATION

(75) Inventors: Sami M. Hinedi, Bellevue; Karl R. Griep, Seattle; Samson Million, Kirkland, all of WA (US)

(73) Assignee: Teledesic LLC, Kirkland, WA (US)

( * ) Notice: Subject to any disclaimer, the term of this patent is extended or adjusted under 35 U.S.C. 154(b) by 0 days.

(21) Appl. No.: 09/215,790

(22) Filed: Dec. 17, 1998

(51) Int. Cl.[7] .................................................. G06F 11/10
(52) U.S. Cl. ............................................ 714/786; 714/790
(58) Field of Search .................................... 714/786, 790, 714/746

(56) References Cited

U.S. PATENT DOCUMENTS

| | | |
|---|---|---|
| 4,811,346 | 3/1989 | Battail . |
| 5,157,671 | 10/1992 | Karplus . |
| 5,406,570 | 4/1995 | Berrou et al. . |
| 5,446,747 | 8/1995 | Berrou . |
| 5,673,291 * | 9/1997 | Dent ..................................... 375/262 |
| 5,682,395 * | 10/1997 | Begin et al. .......................... 714/793 |
| 5,721,745 * | 2/1998 | Hladik et al. ......................... 714/755 |
| 6,108,810 * | 8/2000 | Kroeger et al. ....................... 714/790 |

* cited by examiner

*Primary Examiner*—Phung M. Chung
(74) *Attorney, Agent, or Firm*—Christensen O'Connor Johnson Kindness PLLC

(57) ABSTRACT

A serial concatenated convolutional coding system for a constellation of low-Earth-orbit (LEO) satellites for transmitting input data bits of information is disclosed. The input data bits are systematically outer convolutional encoded (30), producing outer encoded data bits and outer encoded parity bits. Some of the bits of the outer encoded parity bits are remove by a puncturer (32), and the remaining outer encoded parity bits and the outer encoded data bits are bit interleaved (34). The bit interleaved, outer encoded data and remaining parity bits are systematically inner convolutional encoded (36) producing concatenated coded, bit interleaved inner data bits and concatenated coded, bit interleaved inner parity bits. Some of the bits of the concatenated coded, bit interleaved inner parity bits are removed by a puncturer (38), and the remaining concatenated coded, bit interleaved inner parity bits and the concatenated coded, bit interleaved inner data bits are combined (40). Upon receipt by a serial concatenated convolutional decoding system (43), the serially concatenated convolutional coded data and parity bits are iteratively decoded to recover the data bits of information of the original signal. During decoding erasures are inserted (46, 52) for the parity bits removed by puncturing. Decoding is accomplished by soft input, soft output (SISO) modules (48, 54).

21 Claims, 4 Drawing Sheets

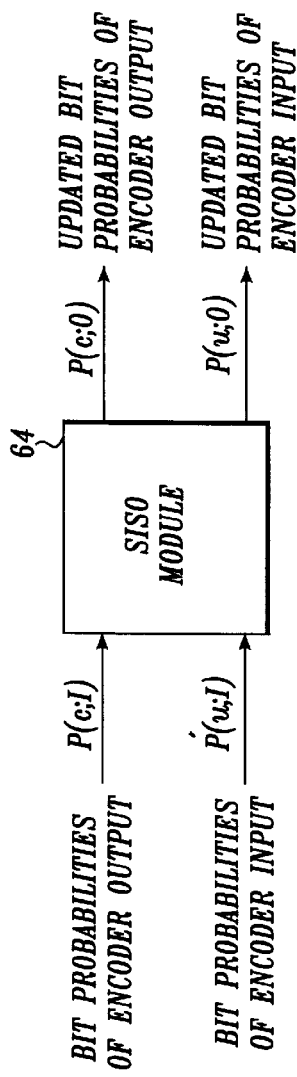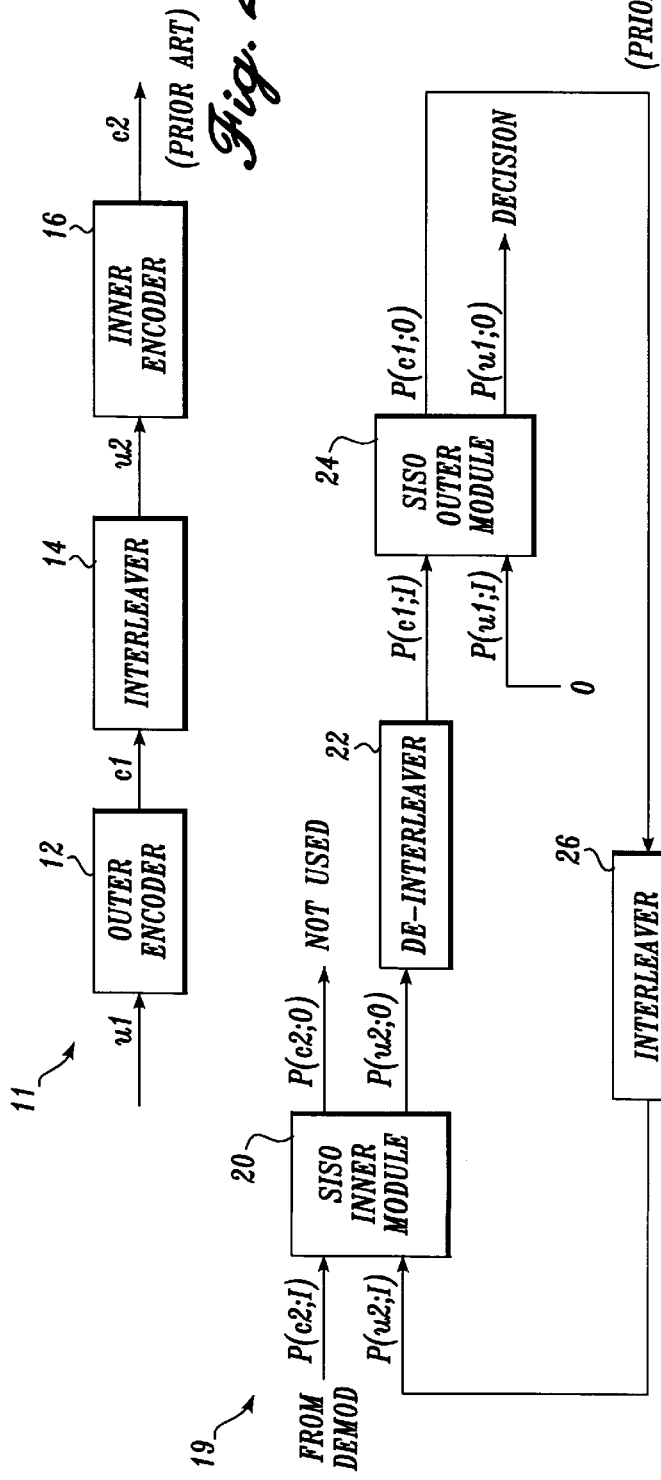

PUNCTURED SERIAL CONCATENATED CONVOLUTIONAL CODING SYSTEM AND METHOD FOR LOW-EARTH-ORBIT SATELLITE DATA COMMUNICATION

FIELD OF THE INVENTION

This invention relates to data communications systems and, more particularly, to digital data communications systems.

BACKGROUND OF THE INVENTION

In recent years the need for global data networking capability has rapidly expanded. In order to meet this need, broadband satellite communication systems have been proposed as an alternative to land-based communication systems. One type of satellite data communication system is described in a variety of U.S. patents assigned to the assignee of this patent application, including U.S. Pat. Nos. 5,386,953; 5,408,237; 5,527,001; 5,548,294; 5,641,135; 5,642,122; and 5,650,788. These patents and other pending applications assigned to the assignee of this patent application describe a satellite communication system that includes a constellation of low-Earth-orbit (LEO) satellites for transmitting data from one location on the Earth's surface to another location. More specifically, each LEO satellite has a communication "footprint" that covers a portion of the Earth's surface as a satellite passes over the Earth. The communication footprint defines the area of the Earth within which ground terminals can communicate with the satellite. Located within each footprint are a large number of cells. During the period of time a cell remains within the borders of a satellite footprint, ground terminals located in the cell transmit data to and receive data from the "servicing" satellite. When a satellite reaches the end of its servicing arc, another satellite in orbit is positioned to "service" the Earth-fixed cells previously covered by the satellite reaching the end of its servicing arc.

Data to be sent from one location on the Earth to another location is transmitted from a ground terminal located within a cell to the satellite serving the cell via an uplink data channel. The data is routed through the constellation of LEO satellites via an intersatellite link data channel to the satellite serving the cell within which the ground terminal of the designated receiver is located. The latter satellite transmits the data to the receiver ground terminal via a downlink data channel. Thus, the constellation of LEO satellites and the ground terminals form a satellite data communication network wherein each ground terminal and satellite forms a node of the network.

Typically, data transmissions sent via uplink, intersatellite link or downlink data channels are broken into digital data packets, each of which include a header and a payload. The header data packets contain address and control information designed to direct the data packets through the satellite constellation to a desired ground terminal. The payload contains the information being transmitted, which is intended for the satellite or the ground terminal or both.

In order for a LEO satellite data communication system to be competitive, it must allow broadband transmission at a relatively low cost. Low cost requires that the satellites be light in weight and relatively inexpensive to manufacture. One way of keeping satellite weight and cost low is to minimize the complexity of electronic signal processing hardware, and keep transmission and reception power requirements low. Unfortunately, low transmission and reception power conflicts with the need for a highly reliable data communication system having a low bit error rate and packet loss rate as it is relatively easy to lose data contained in low-power signals.

One way of improving the reliability of low-power data communication signals that is well-known in the satellite communication field is to forward error correction (FEC) code the data to be transmitted. See U.S. Pat. Nos. 5,117,427; 5,446,747; and 5,473,601 for examples of FEC coding of digital data signals. Other systems and methods which use FEC coding in novel ways to mininize power requirements and maximize reliability are described in U.S. patent application Ser. No. 09/035,645 entitled "Coding System and Method For Low-Earth-Orbit Satellite Data Communication" and U.S. patent application Ser. No. 08/949,412 also entitled "Coding System and Method For Low-Earth-Orbit Satellite Data Communication", both assigned to the assignee of this patent application and both incorporated herein by reference.

The present invention is directed to a coding system for a LEO satellite data communication network that uses FEC coding in a novel way not only to minimize power requirements and maximize reliability but also to minimize the bandwidth used for coding.

SUMMARY OF THE INVENTION

In accordance with this invention, a coding system ideally suited for use in a low-Earth-orbit (LEO) satellite data communication network is provided. Data to be transmitted from one location on the earth to another location is assembled into digital data packets containing a header and a payload which collectively contain input data bits of information. Prior to transmission, the input data bits of information are forward error correction (FEC) coded by a punctured serial concatenated convolutional encoder. The punctured serial concatenated convolutional encoder employs an outer encoder that outer convolutionally encodes the input data bits to produce outer encoded data bits and outer encoded parity bits. The outer encoded parity bits are punctured, and the remaining outer encoded parity bits and the outer encoded data bits are bit interleaved. The resulting bit interleaved, outer encoded data and remaining parity bits are inner convolutionally encoded by an inner encoder to produce concatenated coded, bit interleaved inner data bits and concatenated coded, bit interleaved inner parity bits. The concatenated coded, bit interleaved inner parity bits are punctured, and the remaining concatenated coded, bit interleaved inner parity bits and the concatenated coded, bit interleaved inner data bits are combined to produce serially concatenated convolutional coded data and parity bits. Preferably, the inner and outer convolutional coders are both systematic and recursive.

In accordance with other aspects of this invention, the serially concatenated convolutional coded data and parity bits are decoded by a serial concatenated convolutional decoder. First, the serially concatenated convolutional data and parity bits are decombined to separate data bits from parity bits, producing a data stream and a parity stream. Inner convolutional encoded erasures are inserted into the parity stream to replace the parity bits eliminated by puncturing during encoding. The resulting supplemented parity stream and the data stream are inner decoded by a soft-input soft-output (SISO) inner module to obtain updated bit probabilities of the inner encoder input and output. The updated bit probabilities of the inner encoder input are de-interleaved and decombined to separate data bits from parity bits. Outer convolutional encoded erasures are then inserted into the parity stream to replace the parity bits eliminated by puncturing during encoding. The resulting supplemented parity stream and the data stream are outer decoded by a SISO outer module to obtain updated bit probabilities of the outer encoder input and output. The updated bit probabilities of the outer encoder output are decombined to separate data bits from parity bits, and the parity stream is thereafter punctured. The punctured parity stream and the data stream are bit interleaved and then applied to the SISO inner module where the decoding process described above is repeated. The decoding process is repeated for a predetermined number of cycles, i.e., iterations, until the SISO outer module accurately reproduces the original input data bits of information.

In accordance with alternate aspects of this invention, rather than the parity bits resulting from both the outer convolutional encoder and the inner convolutional encoder being punctured, the parity bits of either the outer convolutional encoder or the inner convolutional encoder can be punctured.

In accordance with further aspects of this invention, prior to serially concatenated convolutional encoding the input data bits of information, the input data bits are outer encoded by another forward error correction code. Preferably, the other forward error correction code is a Reed-Soloman (RS) or a Bose, Chaudhuri and Hocquenghem (BCH) code.

In accordance with alternative aspects of this invention, prior to serially concatenating convolutional encoding the input data bits of information, the headers of the data packets containing the input data bits are outer encoded by a forward error correction code. Preferably, the forward error correction code is a Reed-Soloman (RS) or a Bose, Chaudhuri and Hocquenghem (BCH) code.

As will be readily appreciated from the foregoing description, the invention provides a punctured serial concatenated convolutional coding system that employs convolutional codes and punctures the parity bits resulting from the convolutional codes. Because the parity bits resulting from both inner and outer convolutional encoding are punctured, the resulting serially concatenated convolutional coded data and parity bits achieve a higher code rate without any penalty to bit error rate performance than can be achieved by equivalent unpunctured encoders. Further, because puncturing allows the code rate of the inner and outer convolutional encoders to be lower than corresponding encoders in an unpunctured system capable of achieving the same overall code rate, decoding complexity is reduced. Reducing decoding complexity substantially lowers satellite and ground station hardware and power requirements without loss of the reliability benefits of concatenated error correction coding. The disclosed coding scheme is therefore ideally suited for use in satellite systems, and particularly in a low-Earth-orbit (LEO) satellite system. Embodiments of the invention that employ another outer encoder provide added benefits by further enhancing reliability.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein:

FIG. 1 is a functional block diagram that illustrates a prior art soft-input soft-output (SISO) module usable in an iterative decoder;

FIG. 2 is a functional block diagram that illustrates the structure of a prior art unpunctured serial concatenated convolutional code (SCCC) encoder;

FIG. 3 is a functional block diagram that illustrates the structure of a prior art unpunctured serial concatenated convolutional code (SCCC) decoder;

DETAILED DESCRIPTION OF THE PREFERRED EMBODIMENT

Figure 4:
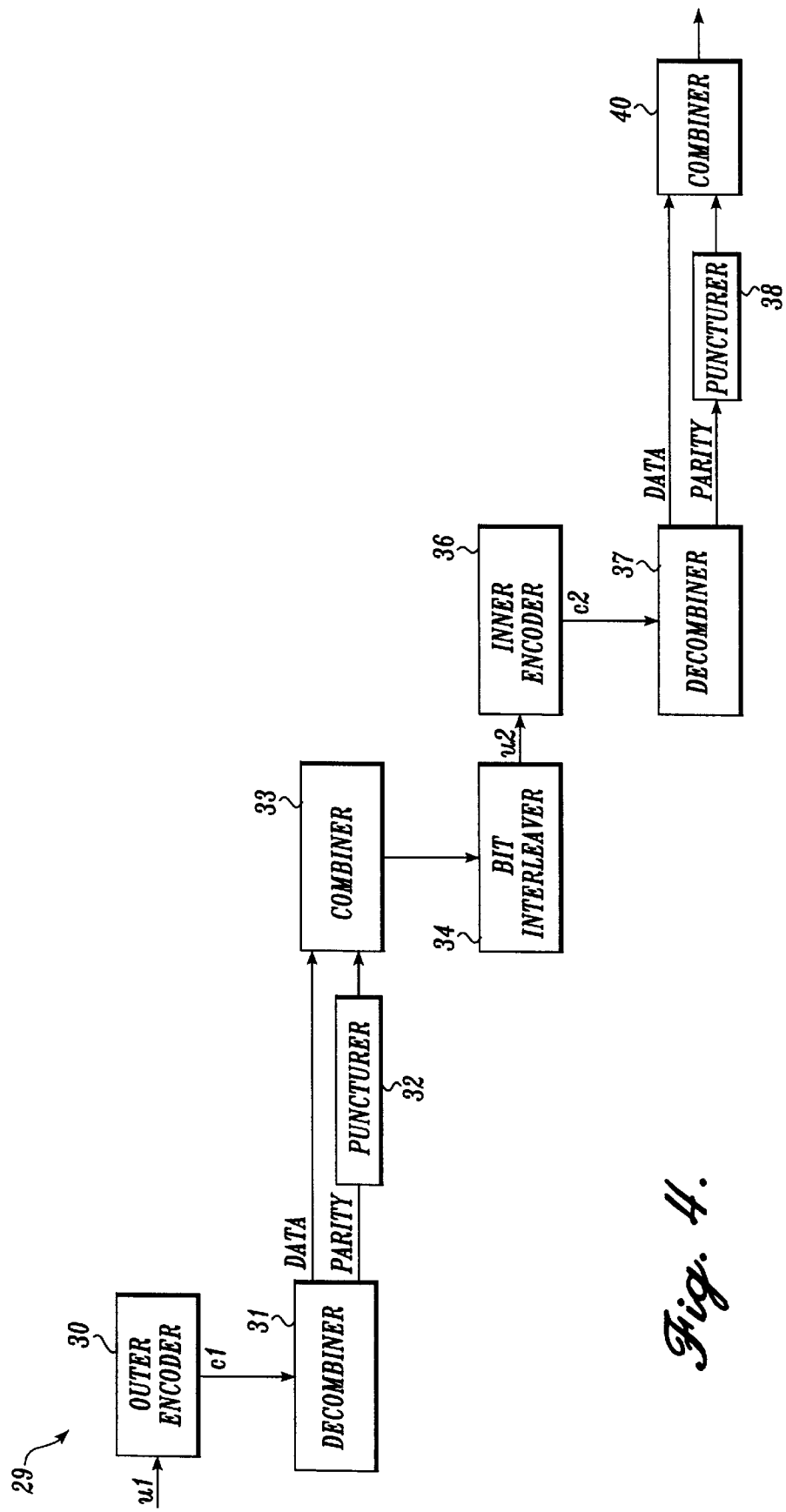
FIG. 4 is a functional block diagram that illustrates the structure of a punctured SCCC encoder formed in accordance with the present invention.

The present invention is directed to a serial concatenated convolutional coding system that is ideally suited for use in satellite communication systems, preferably a low-Earth-orbit (LEO) satellite communication system. A typical LEO satellite communication system is described in U.S. patent application Ser. No. 09/035,645 entitled "Coding System and Method for Low-Earth-Orbit Satellite Data Communication." Briefly, data messages to be transmitted over a LEO satellite communication system are broken into digital data packets, rather than being continuously transmitted. The data packets contain input data bits corresponding to the particular data message to be transmitted. Typically, each data packet includes a header and a payload. The header contains address and control information designed to direct the data packets through the LEO satellite communication network. The payload contains the information being transmitted.

As more fully described below, prior to transmission, the data packets are typically encoded with an unpunctured serial concatenated convolutional code (SCCC) by a SCCC encoder. While this encoding technique is applicable to and described hereinafter with respect to a singular data packet, it is also applicable to multiple data packets. First, the SCCC encoder outer encodes the input data bits of information contained in a data packet. The outer encoding is accomplished by a conventional high rate convolutional encoder. Then, the resulting outer encoded data bits are bit interleaved. Thereafter, the bit interleaved, outer encoded data bits are inner encoded. The inner encoding is again accomplished by a conventional high rate convolutional encoder. After encoding, the serially concatenated convolutional coded data bits are transmitted to a destination where the serially concatenated convolutional coded data bits are decoded.

Decoding the serially concatenated convolutional coded data bits is accomplished by a SCCC decoder which uses a simple iterative decoding technique that processes the received data many times to recover the sent data. This decoding technique is implemented in part by a soft-input soft-output (SISO) module. A SISO module is a generic module that represents a class of decoders that operate in accordance with a variety of different algorithms, and may be represented as a four-port device with two inputs and two outputs. The inputs are the soft symbol information (reliability) that is the a priori probability of both the input and the output of the encoder. The outputs are updated symbol information (reliability) based on the input reliability and the structure of the code. Detailed descriptions of the various algorithms that can be used by a SISO module can be found in the literature. For one example, see S. Benedetto, G. Divsalar, G. Montorsi, and F. Pollara, "A Soft-Input, Soft-Output Maximum A. Posterior: (MAP) Module to Decode Parallel and Serial Concatenated Codes," *The Telecommunications and Data Acquisition Progress Report* 42–127, July–September 1996, Jet Propulsion Laboratory, Pasadena, Calif., pp. 1–20, Nov. 15, 1996.

FIG. 1 illustrates a SISO module implemented with a generic probability function, represented by P, which may be a log likelihood probability function λ. The upper and lower inputs of the illustrated SISO module are the bit probabilities of the encoder output, P(c;I), and the bit probabilities of the encoder input, P(u;I), respectively. The upper and lower SISO outputs are updated bit probabilities of the encoder output, P(c;O), and updated bit probabilities of the encoder input, P(u;O), respectively. As noted above, the "soft" information represented by P(c;I), P(u;I), P(c;O) and P(u;O) can take a variety of forms such as the log likelihood ratio of the bit probabilities.

As will be better understood from the following description, serially concatenated convolutional coded data bits applied to the SCCC decoder are initially decoded by a SISO inner module to obtain updated bit probabilities of the inner encoder input and output. During the initial decoding sequence, the P(u;I) input of the SISO inner module is all erasures. An erasure is a null character having no impact on the output of the SISO module. The P(u;O) output of the SISO inner module is de-interleaved, resulting in the recovery of de-interleaved, updated bit probabilities of the inner encoder input. The de-interleaved, updated bit probabilities of the inner encoder input are further decoded by a SISO outer module, resulting in the recovery of updated bit probabilities of the outer encoder input and output, which can be used to recover the actual original input data bits. The updated bit probabilities of the outer encoder output obtained from the SISO outer module are bit interleaved and applied to the P(u;I) input of the SISO inner module and the process described above is repeated for a predetermined number of iterations.

FIGS. 2 and 3 are functional block diagrams illustrating the major components of the typical prior art unpunctured SCCC encoder 11 and SCCC decoder 19. The SCCC encoder 11 shown in FIG. 2 includes an outer convolutional encoder 12, an interleaver 14, and an inner convolutional encoder 16. Data packets (u1) are applied to the outer convolutional encoder 12, which produces outer encoded data bits (c1). The outer encoded data bits (c1) are bit interleaved by the interleaver 14. The bit interleaved, outer encoded data bits (u2) are inner convolutional encoded by the inner convolutional encoder 16, producing SCCC data bits (c2), which are sent to a modulator (not shown) for transmission.

It will be appreciated that the code rate of an SCCC encoder 11 can vary. The actual code rate will depend upon the individual code rates of the outer convolutional encoder 12 and the inner convolutional encoder 16. For example, if the outer convolutional encoder 12 has a code rate of ¾ and the inner convolutional encoder 16 has a code rate of ⅘, the overall SCCC code rate is ⅗. It will be further appreciated that while the above SCCC encoder includes two convolutional codes, any number of convolutional codes can be serially combined.

The SCCC decoder 19 shown in FIG. 3 includes a SISO inner module 20, a de-interleaver 22, a SISO outer module 24, and an interleaver 26. The SCCC data received from a demodulator (not shown) is applied to the P(c2;I) input of the SISO inner module 20. Initially, erasures are applied to the P(u2;I) input of the SISO inner module. The SISO inner module produces updated bit probabilities of the inner encoder 16 input (u2) and output (c2). The de-interleaver 22 then de-interleaves the updated bit probabilities of the inner encoder input (u2) and applies the result to the P(c1;I) input of the SISO outer module 24. Erasures are applied to the P(u1;I) input of the SISO outer module. The SISO outer module 24 produces updated bit probabilities of the outer encoder 12 input (u1) and output (c1). In order to improve the reliability of the decoded signal, the SCCC decoder 19 repeatedly processes received data packets before accepting the output as reliable. This is accomplished by the interleaver 26 interleaving the updated bit probabilities of the outer encoder output and applying the result to the P(u2;I) input of the SISO inner module 20 and reprocessing the incoming data packets a predetermined number of iterations, as shown in FIG. 3.

As will be appreciated by those skilled in this area of technology and others, the decoding rate of the SCCC decoder 19, illustrated in FIG. 3, and thus the SISO inner module 20 and the SISO outer module 24, must correspond with the code rate of the SCCC encoder 11 illustrated in FIG. 2. Thus, in accordance with the above described example, the SISO inner module 20 must have a decoding rate of ⅘ and the SISO outer module 24 must have a decoding rate of ¾ in order to decode and recover the ⅗ coded original input data bits. While such a high code rate is desirable with respect to minimizing the bandwidth used for coding, it has disadvantages. For example, it can be shown that the SISO inner and outer modules required to meet this decoding rate are very complex and are required to carry out an unacceptably large number of computations, resulting in prohibitively high power consumption when compared to lower rate SISO inner and outer modules.

The present invention is directed to a method and apparatus for forward error correction (FEC) encoding data packets for transmission through a LEO satellite communication system in a way that both enhances reliability and minimizes the bandwidth used for coding while minimizing power consumption. This is accomplished by a serial concatenated convolutional code (SCCC) whose inner and outer convolutional coding is preferably systematic and by puncturing the parity bits of at least one, and preferably both, of the systematic inner and outer convolutional encoded data. As will be better understood from the following description, in some versions of the invention, the data packets are further encoded by an outer code prior to being SCCC encoded. Alternatively, only the header portion of the data packets are further encoded by an outer code prior to being SCCC encoded.

As will be better understood from the following description, the presently preferred way of carrying out the invention is to puncture the parity bits of the systematic inner and outer convolutional codes of a serial concatenated convolutional code encoder. First, the bits of information contained in a data packet are systematically outer convolutional encoded using a conventional systematic convolutional encoder. As well known to those familiar with systematic convolutional encoders, such encoders output a data stream that contains both the original data input to the encoder and parity data. The output data stream is capable of being decombined into two separate data streams, one comprising the original input data and the other comprising parity data. Thus, the systematic outer convolutional encoder first produces a data stream of outer encoded data bits and outer encoded parity bits. This data stream is then decombined into two separate data streams, one comprising outer encoded data bits and the other comprising outer encoded parity bits. The outer encoded parity bits are punctured by a puncturing device. The puncturing device deletes some of the parity bits in order to increase the code rate. The remaining outer encoded parity bits and the outer encoded data bits are combined into one data stream and then bit interleaved, producing bit interleaved, outer encoded data and remaining parity bits. Then, the bit interleaved, outer encoded data and remaining parity bits are systematically inner convolutional encoded using a conventional systematic convolutional encoder. The bit interleaved, outer encoded data and remaining parity bits become the input data for the systematic inner encoder, which produces a data stream of concatenated coded, bit interleaved inner data bits and concatenated coded, bit interleaved inner parity bits. This data stream is then decombined into two separate data streams, one of concatenated coded, bit interleaved inner data bits and the other of concatenated coded, bit interleaved inner parity bits. The concatenated coded, bit interleaved inner parity bits are punctured to further increase the code rate. The remaining concatenated coded, bit interleaved inner parity bits and the concatenated coded, bit interleaved inner data bits are combined, producing serially concatenated convolutional coded data and parity bits.

As will be appreciated by those skilled in this area of technology and others, although the parity bits from preferably both the systematic outer and inner convolutional encoders are punctured, the parity bits from only one or the other need be punctured to achieve higher code rates than can be achieved without any puncturing. Although these alternatives may achieve comparatively higher code rates than the transmission of coded data bits without puncturing, the best bit error rate performance is achieved when only the parity data of both the systematic inner and outer convolutional encoders are punctured.

Even further, as mentioned above, any number of convolutional encoders can be combined to produce a serially concatenated convolutional code, and thus, the outputs from any or all of the convolutional encoders can be punctured. Again, although these alternatives may achieve comparatively higher code rates than the transmission of coded bits in corresponding systems without puncturing, as presently best understood, the best bit error rate performance is achieved where the parity data of each of two systematic convolutional encoders is punctured.

Decoding is accomplished by a SCCC decoder similar in many ways to the one illustrated in FIG. 3 and described above. The incoming data stream applied to the SCCC decoder is initially decombined to separate data bits from parity bits. An inserter inserts erasures into the parity stream to replace the parity bits punctured from the concatenated coded, bit interleaved inner parity bits produced by the systematic inner convolutional encoder. The resulting supplemented parity stream and the separated out data stream are re-combined into an improved data stream and the improved data stream is applied to the P(c2;I) input of a SISO inner module to obtain updated bit probabilities of the inner encoder input and output. The updated bit probabilities of the inner encoder input are de-interleaved and then decombined to separate data from parity. Then an inserter inserts erasures into the parity stream to replace the parity bits punctured from the outer encoded parity bits produced by the systematic outer convolutional encoder. The resulting supplemented parity stream and the separated out data stream are again re-combined into a further improved data stream and the further improved data stream is applied to the P(c1;I) input of a SISO outer module to obtain updated bit probabilities of the outer encoder input and output. The updated bit probabilities of the outer encoder output are manipulated and then reapplied to the P(u2;I) input of the SISO inner module for further cycling to improve the reliability of and, thereby, recover the original input data bits from the P(u;O) output of the SISO outer module. Manipulation is accomplished by first decombining the updated bit probabilities of the outer encoder output to separate data from parity. The parity stream is punctured, and the punctured parity stream is recombined with the data stream to produce a further data stream. The firther data stream is interleaved and the result applied to the P(u2;O) input of the SISO inner module, and the process described above is repeated. After the predetermined number of iterations, the SCCC decoder outputs an accurate reproduction of the original input data at the P(u1;O) output of the SISO outer module.

Returning to the drawings, FIG. 4 is a functional block diagram that illustrates the structure of a punctured SCCC encoder 29 formed in accordance with the present invention. The SCCC encoder 29 includes: a systematic outer convolutional encoder 30; a decombiner 31; an outer puncturer 32; a combiner 33; a bit interleaver 34; a systematic inner convolutional encoder 36; a decombiner 37; an inner puncturer 38; and a combiner 40.

Input data packets (u1) are applied to the systematic outer convolutional encoder 30 which produces a data stream (c1) of outer encoded data bits and outer encoded parity bits. The data stream (c1) is applied to the decombiner 31 which separates the data stream into two data streams, one comprising outer encoded data bits and the other comprising outer encoded parity bits. The outer encoded parity bits are punctured by the outer puncturer 32. As noted above, the outer puncturer 32 essentially deletes some of the parity bits in order to increase the overall code rate. The number of parity bits punctured is user selected and typically based upon the overall rate of the code desired. The remaining outer encoded parity bits and the outer encoded data bits are combined into one data stream by the combiner 33 and then bit interleaved by the bit interleaver 34. Thereafter, the bit interleaved, outer encoded data and remaining parity bits (u2) are inner encoded by the systematic inner convolutional encoder 36 resulting in the production of a data stream (c2) of concatenated coded, bit interleaved inner data bits and concatenated coded, bit interleaved inner parity bits. The data stream (c2) is applied to the decombiner 37, which separates the data stream into two data streams, one comprising concatenated coded, bit interleaved inner data bits and the other comprising concatenated coded, bit interleaved inner parity bits. The concatenated coded, bit interleaved inner parity bits are then punctured by the inner puncturer 38. Again, the number of parity bits punctured is user selected. In general, the amount of puncturing of the inner code is preferably equal to or slightly greater than that of the outer code. However, it will be recognized that any relationship can be selected. The remaining concatenated coded, bit interleaved inner parity bits and the concatenated coded, bit interleaved inner data bits are then combined by the combiner 40 to produce serially concatenated convolutional coded data and parity bits, which are forwarded to a modulator (not shown) for transmission.

Figure 5:
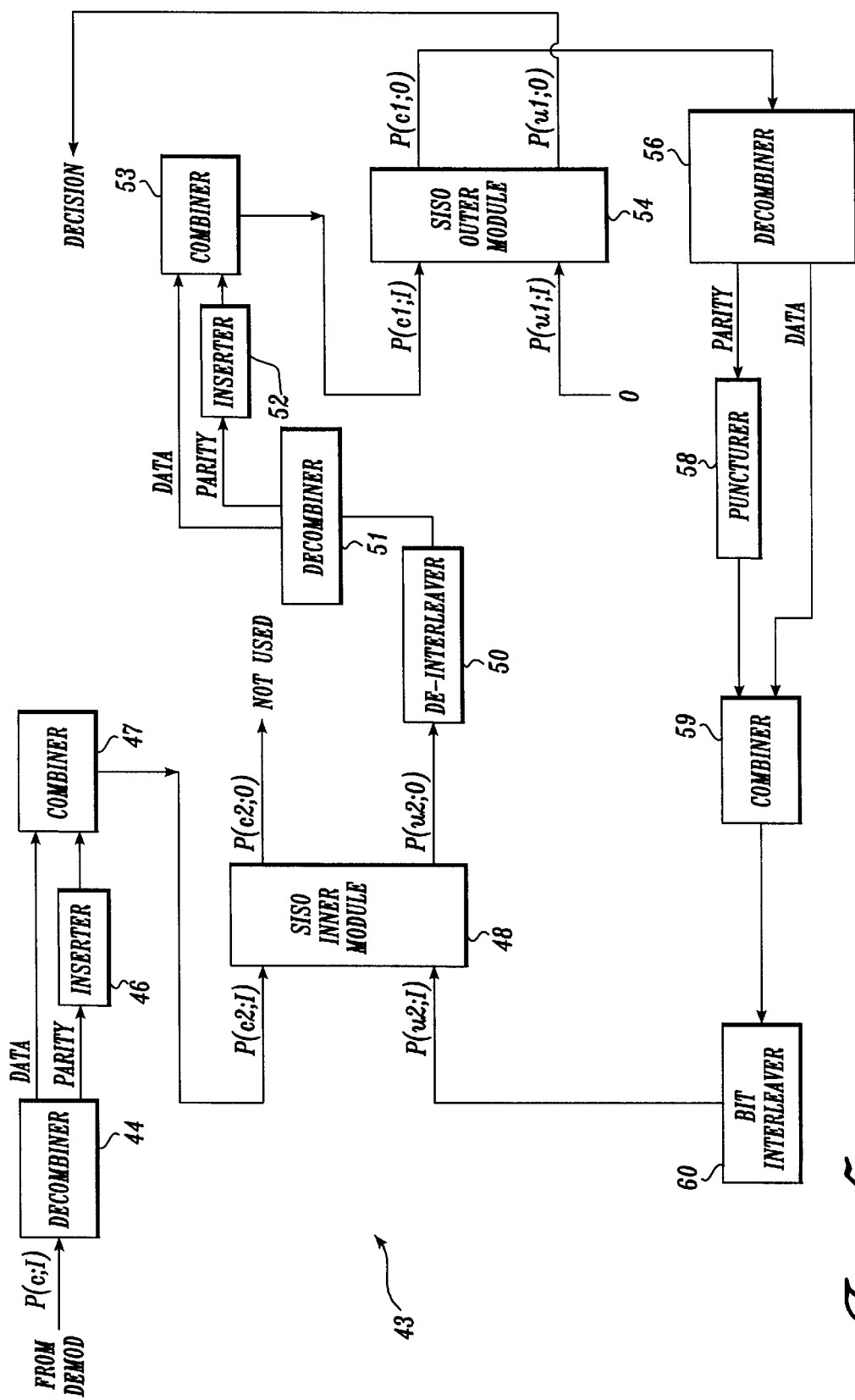
FIG. 5 is a functional block diagram that illustrates the structure of a punctured SCCC decoder formed in accordance with the present invention.

FIG. 5 is a functional block diagram that illustrates a SCCC decoder 43 suitable for decoding the serially concatenated convolutional coded data and parity bits produced by the punctured SCCC encoder 29 illustrated in FIG. 4 and described above. The SCCC decoder 43 illustrated in FIG. 5 includes: a decombiner 44; an inner inserter 46; an inner combiner 47; a SISO inner module 48; a de-interleaver 50; a decombiner 51; an outer inserter 52; an outer combiner 53; a SISO outer module 54; a decombiner 56; a puncturer 58; a combiner 59; and a bit interleaver 60.

After being demodulated by a demodulator (not shown), the incoming data stream is first decombined by the decombiner 44 to separate data bits from parity bits. The inner inserter 46 inserts erasures into the parity stream that replace the parity bits removed from the concatenated coded, bit interleaved inner parity bits by the inner puncturer 38. As one skilled in the art will appreciate, the inserter must have knowledge of the puncturing pattern in order to correctly insert erasures into the parity stream. The inner inserter 46 produces supplemented concatenated coded, bit interleaved inner parity bits.

The inner combiner 47 combines the parity stream and the data stream into an improved data stream, which is applied to the P(c2; I) input of the SISO inner module 48 to obtain updated bit probabilities of the inner encoder 36 input (u2) and output (c2). The de-interleaver 50 de-interleaves the updated bit probabilities of the inner encoder input (u2) and the decombiner decombines the de-interleaved updated bit probabilities of the inner encoder input (u2) to separate parity bits from data bits. The outer inserter 52 inserts erasures into the parity stream to replace the parity bits removed from the outer encoded parity bits by the outer puncturer 32. Again, the inserter must have knowledge of the corresponding puncturing pattern in order to correctly insert erasures into the parity stream. The outer combiner 53 combines the parity stream and the data stream into a further improved data stream.

The further improved data stream is applied to the P(c1;I) input of the SISO outer module 54. The SISO outer module produces updated bit probabilities of the outer encoder input (u1) and output (c1).

As mentioned above, the decoder 43 is an iterative decoder. Iteration involves manipulation of the updated bit probabilities of the outer encoder output produced by the SISO outer module and applying the result to the P(u2;I) input of the SISO inner module 48. Manipulation is accomplished by the decombiner 56 decombining the updated bit probabilities of the outer encoder output produced by the SISO outer module to separate parity from data. The parity stream is punctured by the puncturer 58, and the punctured parity stream is recombined with the data stream by the combiner 59. Obviously, the puncturer 58 punctures the parity stream in a manner similar to the way the inner puncturer 32 of the punctured SCCC encoder 29 punctured the parity bits of the outer encoded data (FIG. 4). The resulting further data stream is interleaved by the bit interleaver 60 and the result applied to the P(u;I) input of the SISO inner module 48. The just described decoding process is repeated as shown in FIG. 5. After a predetermined number of iterations, the P(u1;O) output of the SISO outer module 54 reflects updated bit probabilities of the encoder input that are applied to a decision circuit (not shown) which reproduces the original input data. The number of iterations is user selected allowing a user to optimize the output for a particular application to keep error rates bound in a selected acceptable range.

In accordance with this invention, the use of systematic outer and inner convolutional encoders and puncturing only the parity bits produced by both the systematic outer and inner convolutional encoders achieves a relatively high code rate while reducing the decoding complexity without significant penalty in bit error rate performance. For example, if the systematic outer convolutional encoder 30 has a code rate of ½, the outer puncturer 32 punctures the parity bits to achieve a code rate of ⅔, the systematic inner convolutional encoder 36 has a code rate of ½ and the inner puncturer 38 punctures the parity bits to achieve a code rate of ⅔, the overall code rate is approximately 0.45. If the outer and inner puncturers 32 and 38, respectively, are removed, the code rate of the SCCC encoder drops to 0.25. Since the decoding rates of the SISO outer and inner modules need only correspond to the code rates of their respective encoders, the decoding complexity for both the above given punctured and unpunctured cases are the same. However, the punctured case achieves the more beneficial, overall higher code rate. In order to achieve the same overall code rate without puncturing the inner and outer codes, the rate of the unpunctured inner and outer encoders would have to be higher and thus more complex to decode. Therefore, when compared to an unpunctured SCCC code that achieves the same overall code rate, an SCCC code that punctures the parity bits produced by both the systematic outer and inner encoders is less complicated to decode and does not penalize bit error rate performance.

Besides the lower inner and outer code rates, reducing the complexity of the decoder 43, as described above, the performance of the SCCC decoder 43 is also simplified by the use of systematic encoders. Decoding an SCCC produced by non-systematic encoders requires a SISO outer module to calculate a coded data bit output P(c;O), a coded parity bit output P(c;O), and an original information bit output P(u;O). On the other hand, decoding an SCCC produced by systematic encoders allows P(u;O) to be derived from P(c;O) for both the coded data and parity bits, reducing calculation complexity. In effect, the use of systematic inner and outer encoders in an SCCC system reduces the performance of the SCCC decoder 43, when compared to the use of non-systematic inner and outer encoders.

Figure 6:
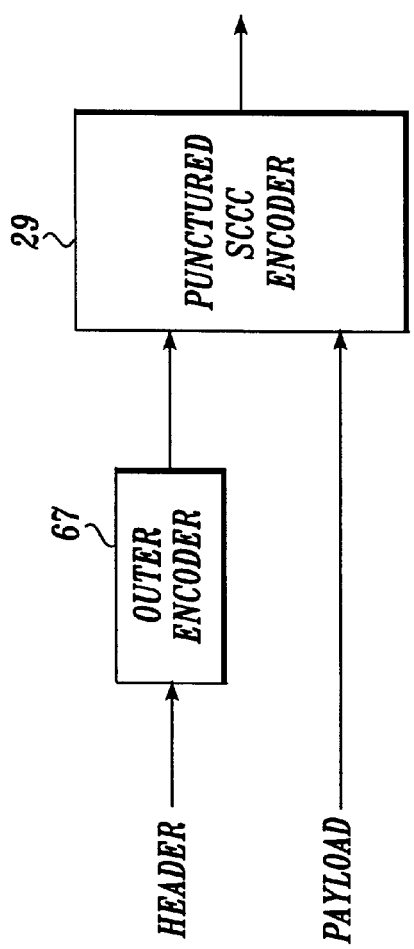
FIG. 6 is a functional block diagram that illustrates the punctured SCCC encoder of FIG. 4 in combination with an outer encoder for encoding the headers of data packets prior to punctured SCCC encoding.
Figure 7:
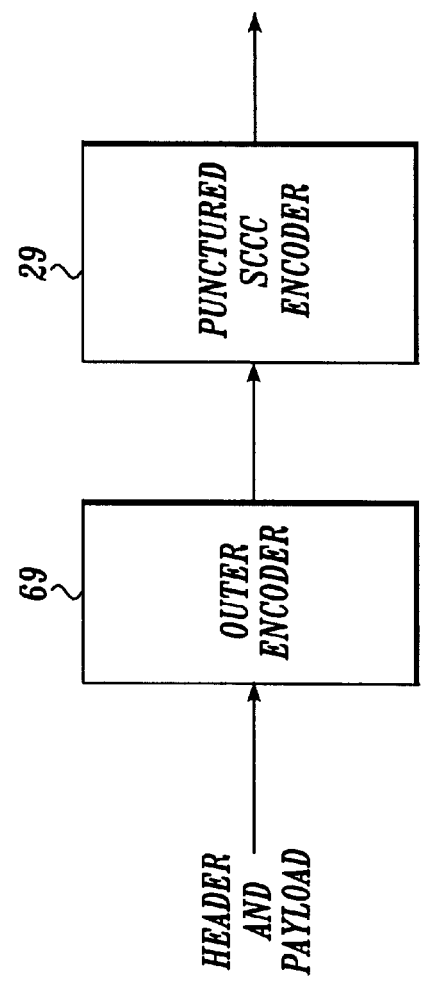
FIG. 7 is a functional block diagram that illustrates the punctured SCCC encoder of FIG. 4 in combination with an outer encoder for encoding the header and payload of data packets prior to punctured SCCC encoding.

FIGS. 6 and 7 are functional block diagrams of the punctured SCCC encoder 29 of FIG. 4 plus an additional outer encoder 67 for pre-encoding only the header of a data packet (FIG. 6) or an additional outer encoder 69 for pre-encoding both the header and the payload of a data packet (FIG. 7). A suitable additional outer encoder 67 or 69 is a conventional forward error correction (FEC) encoder such as a Reed-Soloman (RS) or Bose, Chaudhuri and Hocquenghem (BCH) encoder. As will be appreciated by those familiar with FEC coding and others, applying an additional outer code to the header of the input data bits prior to applying the input data bits to the SCCC encoder 29 improves header cell loss rate performance. Applying an additional outer coder to both the header and payload of the input data bits prior to applying the input data bits to the SCCC encoder 29 improves both payload bit error rate and header cell loss rate. Obviously, encoders of the type illustrated in FIGS. 6 and 7 require decoders that eliminate the additional FEC encoding after removing the FEC coding created by the punctured SCCC encoders 29.

As will be readily appreciated by those skilled in the art and others, a coding system for a LEO satellite data communication network formed in accordance with the invention has a number of advantages. Because the parity bits of the systematic outer and inner convolutional codes are punctured, an overall higher code rate can be achieved when compared to traditional unpunctured serial concatenated convolutional coding systems. As a result, the bandwidth used for coding is miimized. Puncturing the parity bits produced by the systematic outer and inner convolutional encoders to achieve higher rate codes has the advantage of allowing lower rate codes to be used for the outer and inner convolutional encoders to achieve a desired code rate. Lower rate outer and inner convolutional encoders produce an overall code that is easier to decode, thereby minimizing decoder complexity and power requirements.

Furthermore, because puncturing can be used to change the code rate of the overall SCCC and does not affect the structure of the SISO modules, the need to change the hardware that implements the SISO modules, which contains a substantial portion of the computational complexity of the SCCC decoder, is eliminated. This is particularly applicable on a satellite where one cannot easily access the hardware to make necessary changes. Rather, one could make changes to improve performance from the ground via software in accordance with the present invention. Changing the puncturing to vary the code rate only requires that the memory requirements, the puncturing and erasure inserting functions, and the interleaving and de-interleaving functions be changed, all of which are relatively simple to accomplish.

While the preferred embodiment of the invention has been illustrated and described, it should be understood that various changes can be made therein. For example, while, for ease of illustration, the coding, puncturing, interleaving, and decoding elements are depicted as discrete blocks in FIGS. 4, 5, 6, and 7, it is to be understood that the functions associated with the blocks can be carried out in various ways. The functions can be implemented in hardware, software, or a combination of hardware and software. As noted above, the particular data bits punctured, i.e., the parity bits of the outer encoder, the parity bits of the inner encoder, or both, can vary depending upon the acceptable bit error rate for the particular application. Also, the decoding scheme corresponding to the punctured encoding scheme of the present invention can vary. Moreover, it will be appreciated that the punctured serial concatenated convolutional encoder of the present invention can be combined with other encoders to improve bit error rate performance and packet loss rate. Hence, within the scope of the appended claims, it is to be understood that the invention can be practiced otherwise than as specifically described herein.

The embodiments of the invention in which an exclusive property or privilege is claimed are defined as follows:

1. A coding system for a data communication network, said coding system comprising:
   a systematic outer convolutional encoding system for:
   (i) systematically outer convolutional encoding input data bits of information to produce outer encoded data bits and outer encoded parity bits;
   (ii) puncturing bits of said outer encoded parity bits; and
   (iii) bit interleaving said outer encoded data bits and the remaining outer encoded parity bits; and
   a systematic inner convolutional encoding system for systematically inner convolutional encoding said bit interleaved, outer encoded data and remaining parity bits to produce concatenated coded, bit interleaved inner data bits and concatenated coded, bit interleaved inner parity bits.

2. A coding system as claimed in claim 1, wherein said coding system includes a serial concatenated convolutional code (SCCC) decoding system for:
   (i) soft-input soft-output (SISO) inner decoding an incoming data stream to generate updated bit probabilities of said bit interleaved, outer encoded data and remaining parity bits resulting from said bit interleaving and updated bit probabilities of said concatenated coded, bit interleaved inner data bits and said concatenated coded, bit interleaved inner parity bits resulting from said inner convolutional encoding;
   (ii) de-interleaving said updated bit probabilities of said bit interleaved, outer encoded data and remaining parity bits to generate updated bit probabilities of said outer encoded data bits and said remaining outer encoded parity bits;
   (iii) inserting erasures into said updated bit probabilities of said remaining outer encoded parity bits to replace the parity bits punctured after outer convolutional encoding said input data bits of information;
   (iv) SISO outer decoding said updated bit probabilities of said outer encoded data bits and the resulting supplemented outer encoded parity bits to generate updated bit probabilities of said outer encoded data bits and said outer encoded parity bits resulting from said outer convolutional encoding and updated bit probabilities of the original input data bits of information;
   (v) puncturing said updated bit probabilities of said outer encoded parity bits;
   (vi) bit interleaving said updated bit probabilities of said outer encoded data bits and the updated bit probabilities of the remaining outer encoded parity bits to produce updated bit probabilities of bit interleaved, outer encoded data and remaining parity bits;
   (vii) repeating the decoding steps (i) through (vi) for a predetermined number of times using said updated bit probabilities of bit interleaved, outer encoded data and remaining parity bits; and
   (viii) repeating the decoding steps (i) through (iv) to generate further updated bit probabilities of the original input data bits of information.

3. A coding system as claimed in claim 2, wherein said systematic outer convolutional encoding system includes:
   a systematic outer convolutional encoder for systematically outer convolutional encoding input data bits of information to produce outer encoded data bits and outer encoded parity bits;
   a puncturer for puncturing bits of said outer encoded parity bits; and
   a bit interleaver for bit interleaving said outer encoded data bits and the remaining outer encoded parity bits.

4. A coding system as claimed in claim 3, wherein said systematic inner convolutional encoding system includes a systematic inner convolutional encoder for inner convolutional encoding said bit interleaved, outer encoded data and remaining parity bits to produce concatenated coded, bit interleaved inner data bits and concatenated coded, bit interleaved inner parity bits.

5. A coding system as claimed in claim 4, wherein said SCCC decoding system includes:
   a SISO inner module for inner decoding an incoming data stream to generate updated bit probabilities of said bit interleaved, outer encoded data and remaining parity bits resulting from said bit interleaving and updated bit probabilities of said concatenated coded, bit interleaved inner data bits and said concatenated coded, bit interleaved inner parity bits resulting from said inner convolutional encoding;
   a de-interleaver for de-interleaving said updated bit probabilities of said bit interleaved, outer encoded data and remaining parity bits to generate updated bit probabilities of said outer encoded data bits and said remaining outer encoded parity bits;

an inserter for inserting erasures into said updated bit probabilities of said remaining outer encoded parity bits to replace the parity bits punctured after outer convolutional encoding said input data bits of information;

a SISO outer module for outer decoding said updated bit probabilities of said outer encoded data bits and the resulting supplemented outer encoded parity bits to generate updated bit probabilities of said outer encoded data bits and said outer encoded parity bits resulting from said outer convolutional encoding and updated bit probabilities of the original input data bits of information;

a puncturer for puncturing said updated bit probabilities of said outer encoded parity bits; and a bit interleaver for bit interleaving said updated bit probabilities of said outer encoded data bits and the updated bit probabilities of the remaining outer encoded parity bits to produce updated bit probabilities of bit interleaved, outer encoded data and remaining parity bits.

6. A coding system as claimed in claim 5, wherein said systematic inner convolutional encoding system includes a puncturer for puncturing bits of said concatenated coded, bit interleaved inner parity bits after said systematic inner convolutional encoder encodes said bit interleaved, outer encoded data and remaining parity bits.

7. A coding system as claimed in claim 6, wherein said SCCC decoding system includes an inserter for inserting erasures into updated bit probabilities of the remaining concatenated coded, bit interleaved inner parity bits prior to said SISO inner decoding to replace the parity bits punctured after inner convolutional encoding said bit interleaved, outer encoded data and remaining parity bits.

8. A coding system for data communication networks, said coding system comprising:

a systematic outer convolutional encoding system for:
(i) systematically outer convolutional encoding input data bits of information to produce outer encoded data bits and outer encoded parity bits; and
(ii) bit interleaving said outer encoded data bits and said outer encoded parity bits; and a systematic inner convolutional encoding system for:
(i) systematically inner convolutional encoding said bit interleaved, outer encoded data and parity bits to produce concatenated coded, bit interleaved inner data bits and concatenated coded, bit interleaved inner parity bits; and
(ii) puncturing bits of said concatenated coded, bit interleaved inner parity bits.

9. A coding system as claimed in claim 8, wherein said coding system includes a serial concatenated convolutional code (SCCC) decoding system for:
(i) inserting erasures into an incoming data stream of updated bit probabilities of said remaining concatenated coded, bit interleaved inner parity bits to replace the parity bits punctured after inner convolutional encoding said bit interleaved, outer encoded data and parity bits;
(ii) soft-input soft-output (SISO) inner decoding updated bit probabilities of said concatenated coded, bit interleaved inner data bits and the resulting supplemented concatenated coded, bit interleaved inner parity bits to generate updated bit probabilities of said bit interleaved, outer encoded data and parity bits resulting from said bit interleaving;
(iii) de-interleaving said updated bit probabilities of said bit interleaved, outer encoded data and parity bits to generate updated bit probabilities of said outer encoded data bits and said outer encoded parity bits;
(iv) SISO outer decoding said updated bit probabilities of said outer encoded data bits and said outer encoded parity bits to generate updated bit probabilities of said outer encoded data bits and said outer encoded parity bits resulting from said outer convolutional encoding and updated bit probabilities of the original input data bits of information;
(v) bit interleaving said updated bit probabilities of said outer encoded data bits and said outer encoded parity bits to produce updated bit probabilities of said bit interleaved, outer encoded data and parity bits;
(vi) repeating the decoding steps (ii) through (v) for a predetermined number of times using said updated bit probabilities of said bit interleaved, outer encoded data and parity bits; and
(vii) repeating the decoding steps (ii) through (iv) to generate further updated bit probabilities of the original input data bits of information.

10. A coding system as claimed in claim 9, wherein said systematic outer convolutional encoding system includes:
a systematic outer convolutional encoder for outer encoding input data bits of information to produce outer encoded data bits and outer encoded parity bits; and
a bit interleaver for bit interleaving said outer encoded data bits and said outer encoded parity bits.

11. A coding system as claimed in claim 10, wherein said systematic outer convolutional encoding system includes:
a systematic inner convolutional encoder for inner encoding said bit interleaved, outer encoded data and parity bits to produce concatenated coded, bit interleaved inner data bits and concatenated coded, bit interleaved inner parity bits; and
a puncturer for puncturing bits of said concatenated coded, bit interleaved inner parity bits.

12. A coding system as claimed in claim 11, wherein said SCCC decoding system includes:
an inserter for inserting erasures into an incoming data stream of updated bit probabilities of said remaining concatenated coded, bit interleaved inner parity bits to replace the parity bits punctured after inner convolutional encoding said bit interleaved, outer encoded data and parity bits;
a SISO inner module for inner decoding updated bit probabilities of said concatenated coded, bit interleaved inner data bits and the resulting supplemented concatenated coded, bit interleaved inner parity bits to generate updated bit probabilities of said bit interleaved, outer encoded data and parity bits resulting from said bit interleaving;
a de-interleaver for de-interleaving said updated bit probabilities of said bit interleaved, outer encoded data and parity bits to generate updated bit probabilities of said outer encoded data bits and said outer encoded parity bits;
a SISO outer module for outer decoding said updated bit probabilities of said outer encoded data bits and said outer encoded parity bits to generate updated bit probabilities of said outer encoded data bits and said outer encoded parity bits resulting from said outer convolutional encoding and updated bit probabilities of the original input data bits of information; and a bit interleaver for bit interleaving said updated bit probabilities of said outer encoded data bits and said outer encoded parity bits to produce updated bit probabilities of said bit interleaved, outer encoded data and parity bits.

13. A coding system for a data communication network, said coding system comprising:
   a serial concatenated convolutional code (SCCC) encoding system for:
      (i) systematically outer convolutional encoding input data bits of information to produce outer encoded data bits and outer encoded parity bits;
      (ii) puncturing bits of said outer encoded parity bits;
      (iii) bit interleaving said outer encoded data bits and the remaining outer encoded parity bits;
      (iv) systematically inner convolutional encoding said bit interleaved, outer encoded data and remaining parity bits to produce concatenated coded, bit interleaved inner data bits and concatenated coded, bit interleaved inner parity bits; and
      (v) puncturing bits of said concatenated coded, bit interleaved inner parity bits.
   an SCCC decoding system for:
      (i) inserting erasures into an incoming data stream of updated bit probabilities of said remaining concatenated coded, bit interleaved inner parity bits to replace the parity bits punctured after inner convolutional encoding said bit interleaved, outer encoded data and remaining parity bits;
      (ii) soft-input soft-output (SISO) inner decoding updated bit probabilities of said concatenated coded, bit interleaved inner data bits and the resulting supplemented concatenated coded, bit interleaved inner parity bits to generate updated bit probabilities of said bit interleaved, outer encoded data and remaining parity bits resulting from said bit interleaving;
      (iii) de-interleaving said updated bit probabilities of said bit interleaved, outer encoded data and remaining parity bits to generate updated bit probabilities of said outer encoded data bits and said remaining outer encoded parity bits;
      (iv) inserting erasures into said updated bit probabilities of said remaining outer encoded parity bits to replace the parity bits punctured after outer convolutional encoding said input data bits of information;
      (v) SISO outer decoding said updated bit probabilities of said outer encoded data bits and the resulting supplemented outer encoded parity bits to generate updated bit probabilities of said outer encoded data and parity bits resulting from said outer convolutional encoding and updated bit probabilities of the original input data bits of information;
      (vi) puncturing said updated bit probabilities of said outer encoded parity bits;
      (vii) bit interleaving said updated bit probabilities of said outer encoded data bits and the remaining outer encoded parity bits to produce updated bit probabilities of bit interleaved, outer encoded data and remaining parity bits;
      (viii) repeating SCCC decoding steps (ii) through (vii) for a predetermined number of times using said updated bit probabilities of said bit interleaved, outer encoded data and remaining parity bits; and
      (ix) repeating SCCC decoding steps (ii) through (v) to generate further updated bit probabilities of the original input data bits of information.

14. A coding system as claimed in claim 13, wherein said SCCC encoding system includes:
   a systematic outer convolutional encoder for outer encoding input data bits of information to produce outer encoded data bits and outer encoded parity bits;
   a puncturer for puncturing bits of said outer encoded parity bits;
   a bit interleaver for bit interleaving said outer encoded data bits and the remaining outer encoded parity bits;
   a systematic inner convolutional encoder for inner encoding said bit interleaved, outer encoded data and remaining parity bits to produce concatenated coded, bit interleaved inner data bits and concatenated coded, bit interleaved inner parity bits; and
   a puncturer for puncturing bits of said concatenated coded, bit interleaved inner parity bits.

15. A coding system as claimed in claim 14, wherein said SCCC decoding system includes:
   an inserter for inserting erasures into an incoming data stream of updated bit probabilities of said remaining concatenated coded, bit interleaved inner parity bits to replace the parity bits punctured after inner convolutional encoding said bit interleaved, outer encoded data and remaining parity bits;
   a SISO inner module for inner decoding updated bit probabilities of said concatenated coded, bit interleaved inner data bits and the resulting supplemented concatenated coded, bit interleaved inner parity bits to generate updated bit probabilities of said bit interleaved, outer encoded data and remaining parity bits resulting from said bit interleaving;
   a de-interleaver for de-interleaving said updated bit probabilities of said bit interleaved, outer encoded data and remaining parity bits to generate updated bit probabilities of said outer encoded data bits and said remaining outer encoded parity bits;
   an inserter for inserting erasures into said updated bit probabilities of said remaining outer encoded parity bits to replace the parity bits punctured after outer convolutional encoding said input data bits of information;
   a SISO outer module for outer decoding said updated bit probabilities of said outer encoded data bits and the resulting supplemented outer encoded parity bits to generate updated bit probabilities of said outer encoded data and parity bits resulting from said outer convolutional encoding and updated bit probabilities of the original input data bits of information;
   a puncturer for puncturing said updated bit probabilities of said outer encoded parity bits; and
   a bit interleaver for bit interleaving said updated bit probabilities of said outer encoded data bits and the remaining outer encoded parity bits to produce updated bit probabilities of bit interleaved, outer encoded data and remaining parity bits.

16. A coding method for a data communication network, said method comprising:
   (i) systematically outer convolutional encoding input data bits of information to produce outer encoded data bits and outer encoded parity bits;
   (ii) puncturing bits of said outer encoded parity bits;
   (iii) bit interleaving said outer encoded data bits and the remaining outer encoded parity bits; and (iv) systematically inner convolutional encoding said bit interleaved, outer encoded data and remaining parity bits to produce concatenated coded, bit interleaved inner data bits and concatenated coded, bit interleaved inner parity bits.

17. The coding method as claimed in claim 16, wherein said method includes:

(i) soft-input soft-output (SISO) inner decoding an incoming data stream to generate updated bit probabilities of said bit interleaved, outer encoded data and remaining parity bits resulting from said bit interleaving and updated bit probabilities of said concatenated coded, bit interleaved inner data bits and said concatenated coded, bit interleaved inner parity bits resulting from said inner convolutional encoding;

(ii) de-interleaving said updated bit probabilities of said bit interleaved, outer encoded data and remaining parity bits to generate updated bit probabilities of said outer encoded data bits and said remaining outer encoded parity bits;

(iii) inserting erasures into said updated bit probabilities of said remaining outer encoded parity bits to replace the parity bits punctured after outer convolutional encoding said input data bits of information;

(iv) SISO outer decoding said updated bit probabilities of said outer encoded data bits and the resulting supplemented outer encoded parity bits to generate updated bit probabilities of said outer encoded data bits and said outer encoded parity bits resulting from said outer convolutional encoding and updated bit probabilities of the original input data bits of information;

(v) puncturing said updated bit probabilities of said outer encoded parity bits;

(vi) bit interleaving said updated bit probabilities of said outer encoded data bits and the updated bit probabilities of the remaining outer encoded parity bits to produce updated bit probabilities of bit interleaved, outer encoded data and remaining parity bits;

(vii) repeating the decoding steps (i) through (vi) for a predetermined number of times using said updated bit probabilities of bit interleaved, outer encoded data and remaining parity bits; and (viii) repeating the decoding steps (i) through (iv) to generate further updated bit probabilities of the original input data bits of information.

18. The coding method as claimed in claim 17, wherein said method includes puncturing bits of said concatenated coded, bit interleaved inner parity bits after systematically inner convolutional encoding said bit interleaved, outer encoded data and remaining parity bits.

19. The coding method as claimed in claim 18, wherein erasures are inserted into updated bit probabilities of the remaining concatenated coded, bit interleaved inner parity bits prior to SISO inner decoding the updated bit probabilities of said concatenated coded, bit interleaved inner data bits and the resulting supplemented concatenated coded, bit interleaved inner parity bits.

20. A coding method for a data communication network, said method comprising:

(i) systematically outer convolutional encoding input data bits of information to produce outer encoded data bits and outer encoded parity bits;

(ii) bit interleaving said outer encoded data bits and said outer encoded parity bits;

(iii) systematically inner convolutional encoding said bit interleaved, outer encoded data and parity bits to produce concatenated coded, bit interleaved inner data bits and concatenated coded, bit interleaved inner parity bits; and (iv) puncturing bits of said concatenated coded, bit interleaved inner parity bits.

21. The coding method as claimed in claim 20, wherein said method includes:

(i) inserting erasures into an incoming data stream of updated bit probabilities of the remaining concatenated coded, bit interleaved inner parity bits to replace the parity bits punctured after inner convolutional encoding said bit interleaved, outer encoded data and parity bits;

(ii) soft-input soft-output (SISO) inner decoding updated bit probabilities of said concatenated coded, bit interleaved inner data bits and the resulting supplemented concatenated coded, bit interleaved inner parity bits to generate updated bit probabilities of said bit interleaved, outer encoded data and parity bits resulting from said bit interleaving;

(iii) de-interleaving said updated bit probabilities of said bit interleaved, outer encoded data and parity bits to generate updated bit probabilities of said outer encoded data bits and said outer encoded parity bits;

(iv) SISO outer decoding said updated bit probabilities of said outer encoded data bits and said outer encoded parity bits to generate updated bit probabilities of said outer encoded data bits and said outer encoded parity bits resulting from said outer convolutional encoding and updated bit probabilities of the original input data bits of information;

(v) bit interleaving said updated bit probabilities of said outer encoded data bits and said outer encoded parity bits to produce updated bit probabilities of said bit interleaved, outer encoded data and parity bits;

(vi) repeating the decoding steps (ii) through (v) for a predetermined number of times using said updated bit probabilities of said bit interleaved, outer encoded data and parity bits; and (vii) repeating the decoding steps (ii) through (iv) to generate further updated bit probabilities of the original input data bits of information.

* * * * *

UNITED STATES PATENT AND TRADEMARK OFFICE
CERTIFICATE OF CORRECTION

PATENT NO. : 6,202,189 B1
DATED : March 13, 2001
INVENTOR(S) : S.M. Hinedi et al.

It is certified that error appears in the above-identified patent and that said Letters Patent is hereby corrected as shown below:

Column 1,
Item [56], References Cited (Other Publications),
Insert in appropriate order the following:
-- OTHER PUBLICATIONS
Benedetto, S., Garello, R., and Montorsi, G., "A Search for Good Convolutional Codes to be Used in the Construction of Turbo Codes," *IEEE*, vol. 46, No. 9, pp. 1101-1105, 1998. --

Signed and Sealed this

Sixth Day of November, 2001

*Attest:*

NICHOLAS P. GODICI
*Attesting Officer*    Acting Director of the United States Patent and Trademark Office